United States Patent [19]
Aspnes et al.

[11] Patent Number: 5,091,320
[45] Date of Patent: Feb. 25, 1992

[54] ELLIPSOMETRIC CONTROL OF MATERIAL GROWTH

[75] Inventors: David E. Aspnes, Watchung; William E. Quinn, Middlesex Boro, both of N.J.

[73] Assignee: Bell Communications Research, Inc., Livingston, N.J.

[21] Appl. No.: 538,648

[22] Filed: Jun. 15, 1990

[51] Int. Cl.⁵ .......................................... H01Q 21/66
[52] U.S. Cl. ...................................... 437/8; 156/601; 356/369
[58] Field of Search ................... 437/7, 8; 156/601; 356/369

[56] References Cited

U.S. PATENT DOCUMENTS

| | | | |
|---|---|---|---|
| 4,332,833 | 6/1982 | Aspnes et al. | 427/8 |
| 4,434,025 | 2/1984 | Robillard | 156/601 |
| 4,778,251 | 10/1988 | Hall et al. | 350/166 |
| 4,906,844 | 3/1990 | Hall | 250/225 |
| 4,931,132 | 6/1990 | Aspnes et al. | 156/601 |
| 4,934,788 | 6/1990 | Southwell | 350/164 |

OTHER PUBLICATIONS

Qualitative and quantitative assessment of the growth of (Al, Ga)As-GaAs heterostructures by in-situ ellipsometry, G. Laurence, F. Hottier and J. Hallais, Revue Phy. Appl. 16 (1981) 579-589.

F. Hottier et al., "Surface analysis during vapor phase growth," *Journal of Crystal Growth*, 1980, vol. 48, pp. 644-654.

B. Drevillon, "In situ analysis of the growth of semiconductor material by phase modulated ellipsometry from UV to IR," appearing in Surface and Interface Analysis of Microelectronic Materials Processing and Growth, SPIE Proceedings, 1989, vol. 1186, pp. 110-121.

D. Aspnes et al., "High Precision Scanning Ellipsometer," *Applied Optics*, 1975, vol. 14, pp. 220-228.

D. Aspnes et al., "Methods for drift stabilization and photomultiplier linearization for photometric ellipsometers and polarimeters," *Review of Scientific Instruments*, 1978, vol. 49, pp. 291-297.

A. A. Studna et al., "Low-retardance fused-quartz window for real-time optical applications in ultrahigh vacuum," *Journal of Vacuum Science and Technology A,* 1989, vol. 7, pp. 3291-3294.

D. E. Aspnes, "Spectroscopic ellipsometry of solids," appearing in the book *Optical Properties of Solids: New Developments*, ed. B. O. Seraphin (North Holland, Amsterdam, 1976), pp. 800-846.

*Primary Examiner*—Olik Chaudhuri
*Assistant Examiner*—M. Wilczewski
*Attorney, Agent, or Firm*—Leonard C. Suchyta; Charles S. Guenzer

[57] ABSTRACT

A method and apparatus for controlling the growth of a multispecies film. During the film growth, an ellipsometer continuously monitors the surface on which the film is growing. The ellipsometer data is used to calculate the effective complex dielectric constant of the thin-film/substrate structure. A sequence of such data is used in a model calculation to determine the composition of the top portion of the thin film. The measured composition is compared with the target composition and the amount supplied of one of the species is correspondingly changed.

17 Claims, 8 Drawing Sheets

ELLIPSOMETRIC CONTROL OF MATERIAL GROWTH

FIELD OF THE INVENTION

The invention relates generally to a method and apparatus for growing materials. In particular, the invention relates to an optical technique for controlling the thickness and composition of thin films, such as semiconductor films, grown by deposition.

BACKGROUND OF THE INVENTION

Fabrication of advanced electronic and opto-electronic integrated circuits often involves the growth of a multi-layer structure of different compositions, for example III-V semiconductor compounds and their alloys. Sometimes the composition or thickness of the layers is critical and must be well controlled. For instance, quantum-well semiconductor lasers may use $In_xGa_{1-x}As$ in a very thin active layer to emit light. Both the composition or alloying ratio x and the layer thickness will determine the emission wavelength. The procedure of post-growth characterization of composition and growth rate to readjust the deposition parameters for future depositions, although the standard practice in the past (U.S. Pat. Nos. 4,483,725 to Chang and 4,786,616 to Awal et al.), is becoming increasingly unsatisfactory as the complexity of the structures increases (e.g., quaternary compositions) and the required accuracy of growth becomes more demanding. Even once the process parameters have been established, uncontrolled, and possibly uncontrollable, variations in the growth process may introduce enough variation to put a device out of specification, thus reducing the device yield.

Many measurement techniques are amenable to in situ characterization in which the sample is measured while in the growth chamber at ambient pressures comparable to those during the growth process. Thereby, surface contamination and oxidation are minimized. However, if the in situ measurement requires interruption of the growth, it neither accurately characterizes an uninterrupted growth nor is it satisfactory for production-line use.

Real-time characterization of layer deposition, that is, in situ measurement of the growing surface during continuing growth and without interruption, provides a better understanding of the growth process. However, using that characterization for real-time control of the growth has seldom been implemented. Aspnes et al have disclosed real-time growth control in U.S. patent application, Ser. No. 07/255,140, filed Oct. 7, 1988. They relied on reflectance difference spectroscopy, which measures the difference in reflected intensities for two polarizations of light incident upon the growing surface. Their technique effectively characterized the near surfaces of III-V semiconductors, specifically, whether the uppermost layer was a group-III cation layer or a group-V anion layer. Therefore, they suggested using their spectrometer to interrupt the supply of growth species in atomic layer epitaxy, in which a crystal is grown an atomic layer at a time. Reflection high-energy electron diffraction (RHEED) provides similar information about the near-surface region. Both techniques could in principle be used by integrating over time to obtain thickness and composition information of a growing layer. Atomic layer epitaxy is, however, considered too difficult and slow for production-line semiconductor fabrication.

Optical ellipsometry has long been recognized as providing accurate characterizations of semiconductors and other materials, their surfaces, layer compositions and thicknesses, and overlying oxides. Ellipsometry probes the surface to within an absorption length of the measuring radiation, a useful range for layer growth. As will be discussed later, it can measure the real and imaginary effective dielectric constants, which can be interpreted in terms of layer thickness and composition. The probing wavelength may be changed in spectro-ellipsometry (SE), thus varying the absorption length and the dependence of the data on the composition of the material. Hottier et al have disclosed real-time ellipsometric characterization in a technical article entitled "Surface analysis during vapour phase growth", appearing in Journal of Crystal Growth, volume 48, 1980 at pages 644-654. In a related article entitled "Qualitative and quantitative assessments of the growth of (aluminum, gallium) arsenide-gallium arsenide heterostructures by in situ ellipsometry" appearing in Revue Physique Applique, volume 16, 1981 at pages 579-589, Laurence et al emphasized that post-experiment calculations were required to derive the composition and thickness of grown layers.

Drevillon discussed in situ ellipsometry in a technical article entitled "In situ analysis of the growth of semiconductor materials by phase modulated ellipsometry from UV to IR" appearing in Surface and Interface Analysis of Microelectronic Materials Processing and Growth, SPIE Proceedings, volume 1186, 1989 at pages 110-121. He concluded the article with the observation that his work demonstrated the potential of ellipsometry for in situ process control.

Robillard has disclosed the use of ellipsometry for the control of thin film growth in U.S. Pat. No. 4,434,025. However, Robillard was concerned primarily with the amorphicity or crystallinity of the film, and thus with the growth temperature. He could thus derive sufficient control information from a single set of ellipsometric data taken for all analyzer angles. He also measured the film thickness by comparing relative intensities of two peaks in the set, which peaks had been equalized in a calibration step prior to thickness measurement. Robillard's technique however lacks control over the film composition.

SUMMARY OF THE INVENTION

Accordingly, an object of the invention is to provide real-time control of layer deposition.

Another object is to provide composition and thickness control for the growth of semiconductor structures having multiple layers of different compositions.

A further object is to provide such control with the accuracy available with ellipsometry.

The invention can be summarized as the method and apparatus for the real-time control of material growth by ellipsometry. While a film is being grown on a substrate of different composition, an ellipsometer measures complementary ellipsometric data of the film/substrate combination. A series of such data are used in one of several models to approximate the dielectric constants, and thus the composition and thickness, of the thin film having a thickness less than the optical thickness of the ellipsometer radiation. For optically thick films, only composition is determined. Control circuitry compares the measured composition to the target composition and dynamically corrects the growth parameters for the film growth.

DETAILED DESCRIPTION

The invention utilizes ellipsometric characterization of a growing film for the real-time control of the growth process. Before fully describing the invention, the principles of ellipsometry will be described, followed by the description of some preliminary experiments, all useful for understanding the invention.

Ellipsometry

Figure 1:
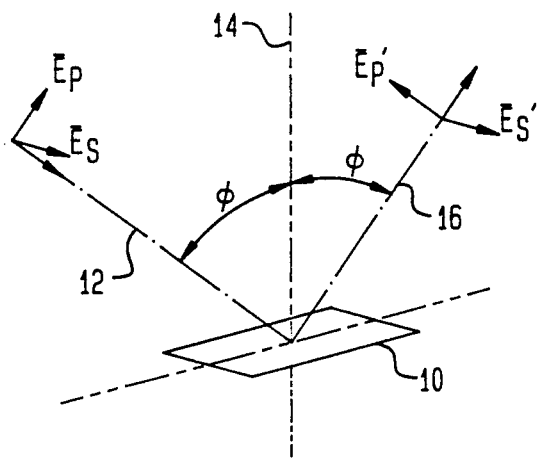
FIG. 1 is an illustration useful in understanding ellipsometry.

In FIG. 1 is illustrated some of the formalism required in discussing ellipsometry. A sample to be tested has a specular surface 10. Light falls on the surface 10 along an incident direction 12 at an angle $\phi$ with respect to a normal 14 of the surface 10. The incident light is specularly reflected from the surface 10 in a reflected direction 16, also at the angle $\phi$ to the normal 14. The transmitted component is here ignored. The light is assumed to be monochromatic. A plane of incidence is defined to include the incident and reflected directions 12 and 16, and thus to be perpendicular to the surface 10.

The incident light has two polarization directions characterized by complex field amplitudes $\bar{E}_s$ for the electrical polarization parallel to the plane of the surface 10 (that is, perpendicular to the plane of incidence) and $\bar{E}_p$ for the electrical polarization perpendicular to $\bar{E}_s$ (that is, lying in the plane of incidence). Thus, four quantities in the two complex amplitudes define the incident light. However, one is the instantaneous phase of the light wave and is thus generally unmeasurable and unimportant, and another is related to the total intensity of the light and is important only for the experimental implementation of the ellipsometer. The polarization characteristics of the incident light are determined by only two parameters, which are conveniently written as the intensity-independent, complex ratio $\bar{\chi} = \bar{E}_p/\bar{E}_s$ of the complex field amplitudes, where $\bar{\chi}$ is referred to as the polarization state.

Similarly, the reflected complex amplitudes are $\bar{E}_s'$ perpendicular to the plane of incidence and $\bar{E}_p'$ parallel to the plane of incidence. The complex reflectance coefficients are then defined by $$\bar{r}_p = \bar{E}_p'/\bar{E}_p, \tag{1}$$

and $$\bar{r}_s = \bar{E}_s'/\bar{E}_s. \tag{2}$$

The complex reflectance ratio $\bar{\rho}$ is defined as $$\bar{\rho} = \bar{r}_p/\bar{r}_s, \tag{3}$$

and is often represented by the real angles $\psi$ and $\Delta$ defined as $$\bar{\rho} = \tan\psi e^{i\Delta}. \tag{4}$$

In an ellipsometric experiment, the state of polarization $\bar{\chi}$ of the incident beam is established by, for example, passing the beam through a linear polarizer. The beam is then reflected at non-normal incidence from the surface, which changes the polarization state from $\bar{\chi}$ to $\bar{\chi}'$. The value of $\bar{\chi}'$ is then determined experimentally by methods that will be described below. The ratio $\bar{\chi}'/\bar{\chi}$ is then calculated, leading to $$\frac{\bar{\chi}'}{\bar{\chi}} = \frac{\bar{E}_p'\bar{E}_s}{\bar{E}_p\bar{E}_s'} = \frac{\bar{r}_p}{\bar{r}_s} = \bar{\rho}. \tag{5}$$

Although ellipsometric data are usually presented in terms of the complementary data $\psi$ and $\Delta$ or $\tan\psi$ and $\cos\Delta$, it is convenient for material characterization to define a complex pseudo-dielectric function having complementary real and imaginary parts $$<\bar{\epsilon}> = <\epsilon_1> + i<\epsilon_2> \tag{6}$$

for the model of a thick film adjacent a vacuum. That is, the surface 10 is assumed to be the upper surface of a semi-infinite, homogeneous material having a complex dielectric constant $<\bar{\epsilon}>$ and the area above the surface 10 has unity dielectric constant. The pseudo-dielectric constant and the complex reflectance ratio are related by $$<\bar{\epsilon}> = \sin^2\phi + \sin^2\phi \tan^2\phi \left[\frac{1-\bar{\rho}}{1+\bar{\rho}}\right]^2, \tag{7}$$

which is used to relate the measured $\bar{\rho}$ to the properties of the sample through the model calculation.

If the thickness of a homogeneously grown layer approaches the absorption length of the light, $<\bar{\epsilon}>$ approaches the complex dielectric constant $\bar{\epsilon}$ of the material of that layer. Ellipsometry thus more easily relates to material properties than does reflectance difference spectroscopy, which measures $$|\bar{r}_p|^2 - |\bar{r}_s|^2. \tag{8}$$

Figure 2:
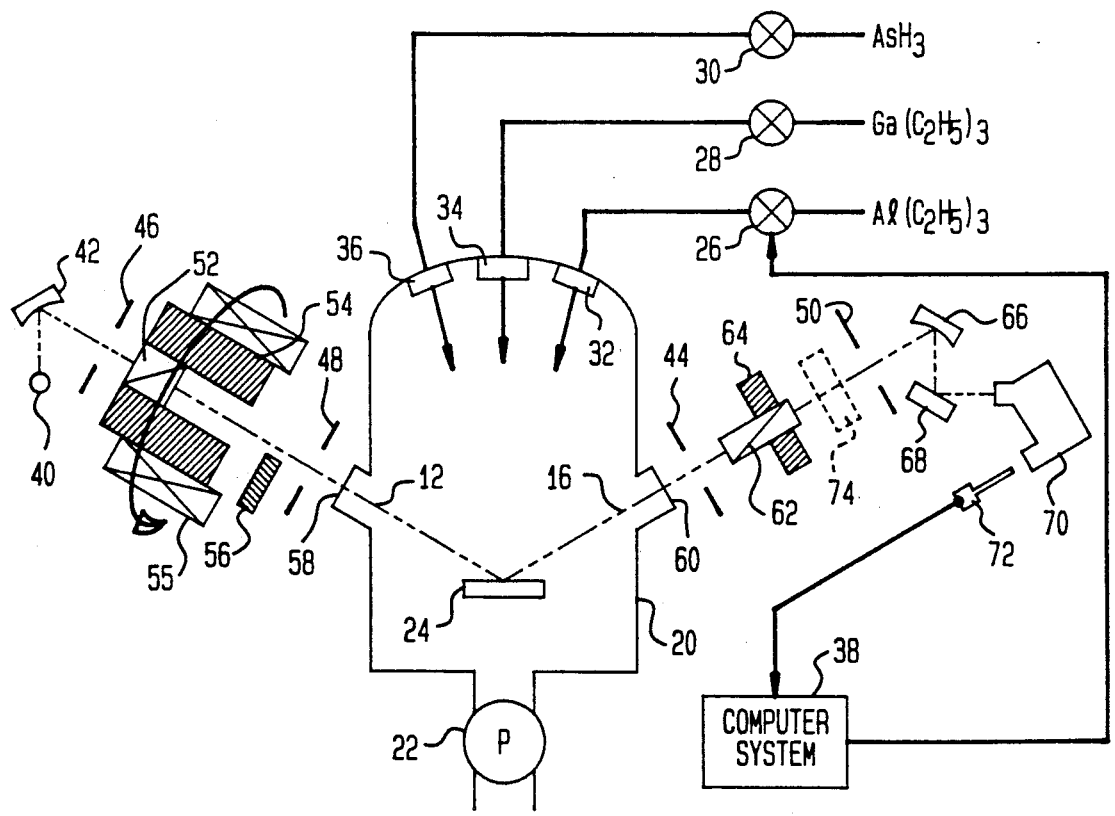
FIG. 2 is a block diagram of the ellipsometric growth control apparatus of the present invention.

An embodiment of the present invention is illustrated in the block diagram of FIG. 2 and includes a thin film growth system, an ellipsometer attached to the growth system, and a computer-based controller receiving data from the ellipsometer and controlling the operation of the growth system.

Thin Film Growth System

In a demonstration of the invention, the growth system was a Model V80H system commercially available from VG Instruments, Inc. of Danvers, Mass. This system allows growth by organo-metallic molecular beam epitaxy (OMMBE), which combines molecular beam epitaxy with chemical vapor deposition. As illustrated in FIG. 2, a vacuum chamber 20 is pumped by a diffusion pump 22 to a base pressure of $10^{-11}$ Torr. A substrate 24 is thermally bonded to an unillustrated heated substrate holder. For growth of the AlGaAs family of materials, gaseous triethylaluminum $(Al(C_2H_5)_3)$, triethyl gallium $(Ga(C_2H_5)_3)$, and arsine $(AsH_3)$ are supplied through respective metering valves 26, 28, and 30 to ports 32 and 34 and a cracking unit 36. The cracking unit 36 cracks the $AsH_3$ into $As_2$ and $H_2$. Thereby, controlled beams of $Al(C_2H_5)_3$, $Ga(C_2H_5)_3$, and $As_2$ are irradiated upon the substrate 24. The alkyls $Al(C_2H_5)_3$ and $Ga(C_2H_5)_3$ crack on the substrate surface to provide Al and Ga. For the AlGaAs system, an overpressure of As is maintained so that the growth is controlled by the amounts of Ga and Al.

The OMMBE growth system is controlled by a computer system 38, with keyboard and display. The purchased growth system included a first PDP 1153 computer and interfaces for the growth system. A second computer, a Digital Equipment Corporation computer, model 1173, was added for the ellipsometer. The Ga and As metering valves are controlled by the first computer. However, the illustrated control line to the Al metering valve 26 was reconnected to the second computer for purposes of feedback growth control.

Ellipsometer Optics

As discussed above, an ellipsometer establishes light in a definite state of polarization and analyzes the state of polarization that results after the light has been reflected at non-normal incidence from a specular surface. Many different configurations have been devised to perform these functions, as summarized in, e.g., the book *Ellipsometry and Polarized Light* by R. M. A. Azzam and N. M. Bashara (North-Holland, Amsterdam, 1977). The ellipsometer part of FIG. 2 is a rotating-polarizer variant of the rotating-analyzer ellipsometer previously described by D. E. Aspnes et al. in a technical article entitled "High precision scanning ellipsometer," appearing in Applied Optics, volume 14, 1975 at pages 220-228 and further elaborated by them in another technical article entitled "Methods for drift stabilization and photomultiplier linearization for photometric ellipsometers and polarimeters," appearing in Review of Scientific Instruments, volume 49, 1978, at pages 291-297.

In FIG. 2, a light source 40 is a 75 W short-arc Xe lamp contained in an unillustrated housing. The light beam from the lamp 40 is focused by a concave mirror 42 onto an iris 44, which is the third of four irises 46, 48, 44, and 50 spatially defining the incident beam 12 and the beam 16 reflected off the substrate 24. The first two irises 46 and 48 are in the incident beam 12; the last two irises 44 and 50 are in the reflected beam 16. The lamp housing and other shielding surrounding the incident beam 12 minimize thermals (air convection currents that cause the lamp image to shimmer and therefore introduce unwanted noise).

A rotatable quartz Rochon prism 52 acts as the polarizer and splits the incident beam 12 into an undeviated primary beam and an orthogonally polarized 2° deflected secondary beam, both beams being nearly linearly polarized. The unwanted secondary beam is blocked by the second iris 48. The polarizer 52 is carried in a hollow shaft 54 of a motor assembly 55 that rotates the prism 52 at a mechanical rotational frequency of 58 Hz. A shutter 56 is closed for part of a measurement cycle to establish a zero baseline for the detection electronics to be described below and also to establish stray light levels.

The incident beam 12 enters the vacuum chamber 20 through a window 58, strikes the substrate 24, and is reflected therefrom as the reflected beam 16, which passes out of the vacuum chamber 20 through another window 60. Both the windows 58 and 60 are fabricated according to the plans disclosed by Studna et al. in a technical article entitled "Low-retardance fused-quartz window for real-time optical applications in ultrahigh vacuum," appearing in *Journal of Vacuum Science and Technology* A, volume 7, 1989 at pages 3291-3294. Thus, they introduce minimum optical distortion and can be locally baked to remove arsenic. Both the incident and reflected beams 12 and 16 form an angle $\phi$ of about 70° with the normal of the substrate 24.

A second quartz Rochon prism 62 acts as the reflected beam analyzer and splits the reflected beam 16 into orthogonal nearly linearly polarized components in the same manner as the polarizer 52. The unwanted secondary beam is blocked by the fourth iris 50. The analyzer 62 is mounted in a computer-controlled indexing head 64 to precisely control its azimuth angle A with respect to the plane of incidence on the substrate 24, both for signal analysis and to establish the precise azimuth of the plane of incidence as will be described below. A focusing mirror 66 and a folding mirror 68 direct the primary beam into the entrance slit of a monochromator 70, which disperses the wavelengths and establishes which of the wavelengths shall emerge from the exit slit and be detected by a photomultiplier 72. For wavelengths longer than about 370 nm, an optical filter 74 is placed into the primary reflected beam 16 to block second-order light from passing through the monochromator 70.

Ellipsometer Electronics

The ellipsometer of FIG. 2 is automatically controlled by the second computer in the computer system 38. The electronics interfacing the computer to the ellipsometer will now be discussed.

An optical encoder is attached to the shaft 54 containing the polarizer 52 and provides two pulsed signals to the computer system 38. The first signal is a pulse that repeats at 120 equal intervals over a single rotation of the shaft 54, that is, at a frequency of 6960 Hz. At each of these pulses, an analog-to-digital converter card input of the computer system 38 reads the output voltage of the amplifier of the photomultiplier 72 and the computer system 38 stores the intensity data for further digital processing. The second signal from the optical encoder on the shaft 54 is a level shift that occurs at the first and sixty-first pulses of the first signal and is used to synchronize the Fourier analysis procedure to be discussed below to the azimuth angle of the shaft 54. The first signal pulse is received by the "read" input of the A/D input card in the computer system 38. The level shift of the second signal is received by one input bit of a 16-bit binary input/output card in the computer system 38.

The motor 55 driving the shaft 54 is a hysteresis synchronous capacitance motor driven by a power amplifier incorporating a precision oscillator for establishing the rotation frequency of the polarizer 52.

The lamp 40 is powered by a dedicated DC power supply including a pulse source to initiate the arc.

The shutter 56 is operated by a driver and is opened and closed according to one output bit of the 16-bit input/output card.

The computer system 38 further provides control signals in the form of pulses from the 16-bit input/output card to stepper motors driving the indexing head 64 and the wavelength selector of the monochromator 70. Each stepper motor receives two binary lines for bidirectional rotation.

The output current of the photomultiplier 72 is directly proportional to the instantaneous detected intensity of the reflected beam 16 at the selected wavelength, several of which data are used to determine the polarization state of the reflected light. The photomultiplier current is converted to a voltage by an amplifier. This amplifier provides low-pass filtering with a time constant of approximately three triggering cycles (500 $\mu$s) to eliminate high-frequency noise. The amplifier also receives and mixes with the photomultiplier current a small triangular current waveform and a DC offset current. The triangular current waveform is generated by clipping and integrating a small fraction of the AC output of the power supply for the motor 55 of the shaft 54. The triangular waveform averages out inaccuracies in the step increments of the A/D converter card. The DC offset current is used to ensure that the signal supplied to the A/D converter is positive so as to fall within its 0–10 V range. The output of the photomultiplier amplifier is supplied to the "data" input of the A/D input card in the computer system 38.

The gain of the photomultiplier 72 is controlled by the computer system 38 through the photomultiplier power supply, which proportionately controls the voltage supplied to the photomultiplier tube 72. A D/A (digital-to-analog) output of the computer system 38 supplies an analog voltage directly to the power supply to control its output voltage.

Another D/A output of the second computer in the computer system 38 has been adapted to control the metering valve 26.

Figure 3:
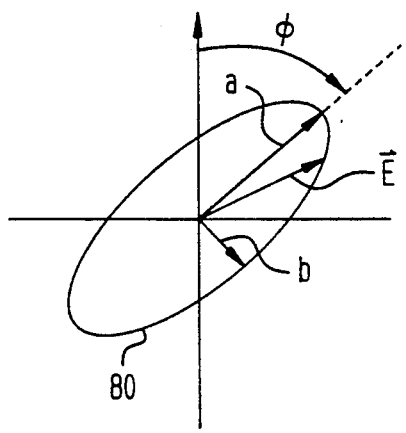
FIG. 3 is another illustration useful in understanding ellipsometry.
Figure 4:
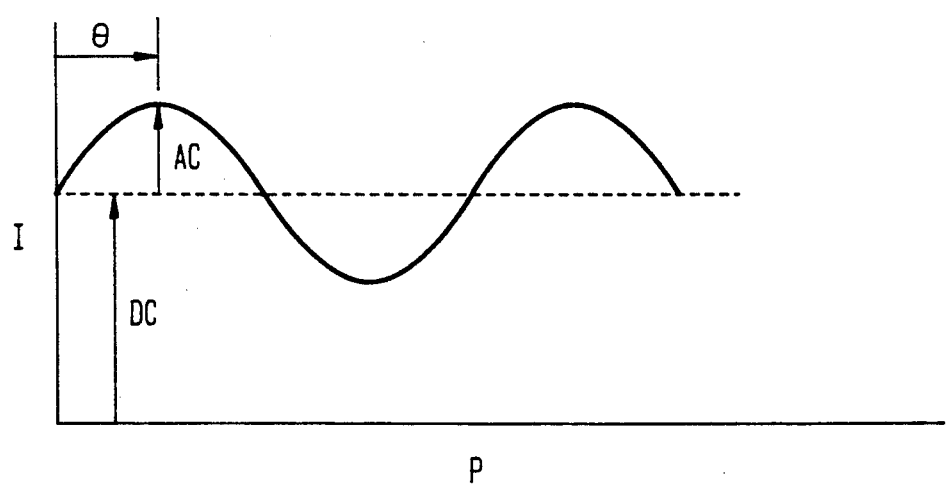
FIG. 4 is an illustration of typical raw data recorded by an ellipsometer.

The method of determining the polarization state of the reflected radiation will be explained with reference to FIG. 3 and using the example of an ellipsometer with a stationary polarizer and rotating analyzer, which is fully equivalent to the ellipsometer of FIG. 2 having a rotating polarizer 52 and stationary analyzer 62. If an incident beam is assumed linearly electrically polarized in some direction, usually 30° with respect to the plane of incidence but here illustrated vertically, upon reflection from a specular surface it becomes in general elliptically polarized, as indicated schematically by an ellipse 80. That is, the instantaneous reflected electric vector $\vec{E}$ has a direction and magnitude tracing the ellipse 80 at the optical frequency. The ellipse is characterized by a major axis a and minor axis b and by an azimuth angle $\phi$ of the major axis a. Because absolute intensity is not material in ellipsometry, the polarization state is determined by the azimuth angle $\phi$ and the minor/major axis ratio b/a. As a polarization analyzer passes only that component of the polarization ellipse 80 along the analyzer's principal axis, a rotating analyzer (or polarizer) can therefore be used to sample the ellipse 80 at various points around it, thereby establishing its geometric properties. Specifically, the photomultiplier 72 measures an intensity proportional to $|\vec{E}|^2$ at a point on the ellipse 80 selected by the angle P of the rotating analyzer (polarizer). The ellipsometer therefore measures an angularly dependent intensity, such as that plotted in FIG. 4. Such a sinusoidally varying intensity I is fit within the accuracy of the measurement to the equation $$I = c_0 + c_1 \cos(2P) + c_2 \sin(2P). \tag{9}$$

Ellipsometric data are measured over the full $2\pi$ range of angle P and data are Fourier transformed to yield the DC, since, and cosine coefficients $c_0$, $c_1$, and $c_2$, which are related to the $\psi$ and $\Delta$ representation of the complex reflectance ratio $\bar{\rho}$ of Equation (4) by $$\tan\psi = \left(\frac{c_0 + c_1}{c_0 - c_1}\right)^{\frac{1}{2}} \tan A \tag{10}$$

and $$\cos\Delta = \frac{c_2}{(c_0^1 - c_1^2)^{\frac{1}{2}}}, \tag{11}$$

where A is the angle of the principal axis of the fixed analyzer with respect to the plane of incidence of FIG. 1.

Figure 5:
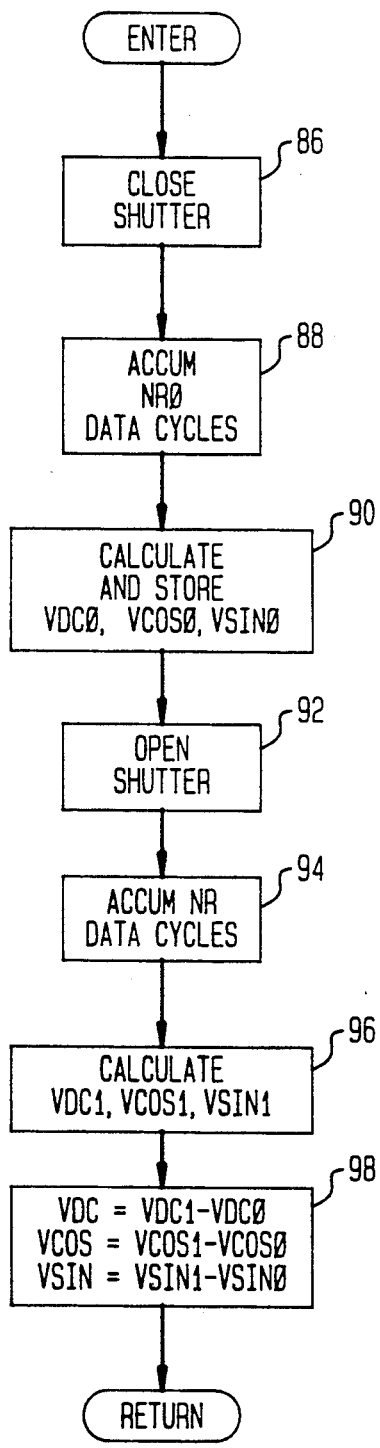
FIG. 5 is a logic flow chart for the ellipsometer measurement cycle.

The data acquisition for the ellipsometer is controlled by a program written in Fortran and Macro languages which is stored in and executed by the second computer in the computer system 38. The flow diagram for the data acquisition subroutine is shown in FIG. 5. In the first step 86, the shutter 56 is closed in order to measure the background contribution. Step 88 accumulates a number NR0 of data cycles of intensity data from the photomultiplier 72. Each data cycle corresponds to half a revolution of the polarizer 52 or to 60 intensity measurements. The beginning of step 88 is synchronized with the level shift from the rotary encoder on the shaft 54, to which the azimuth angle of the analyzer 62 was fixed by the head 64 in a precalibration step. Each of the 60×NR0 intensity data is synchronized by the 6960 Hz pulse train from the rotary encoder. After the accumulation of the data, they are checked to see that no data have been dropped. In the rare case of dropped data, the step 88 is repeated. The data accumulated in step 88 are Fourier analyzed in step 90 to yield the DC, cosine and sine background coefficients, here represented by VDC0, VCOS0, and VSIN0, which are then stored. See the *Applied Optics* article of Aspnes et al for the Fourier analysis procedure.

In step 92, the shutter 56 is opened for the measurement. In step 94, a number NR of data cycles of intensity data are accumulated. The timings in step 94 follow the same timings as in the background step 88. The values of NR0 and NR are chosen by the operator and are typically 10 and 100, respectively, representing respectively 5 and 50 mechanical rotations of the polarizer 52. In step 96, Fourier analysis produces the DC, cosine and sine measured coefficients, VDC1, VCOS1, and VSIN1. In step 98, the background coefficients are subtracted from the measured coefficients to yield the corrected coefficients VDC, VCOS, and VSIN, corresponding to $c_0$, $c_1$, and $c_2$.

Figure 6:
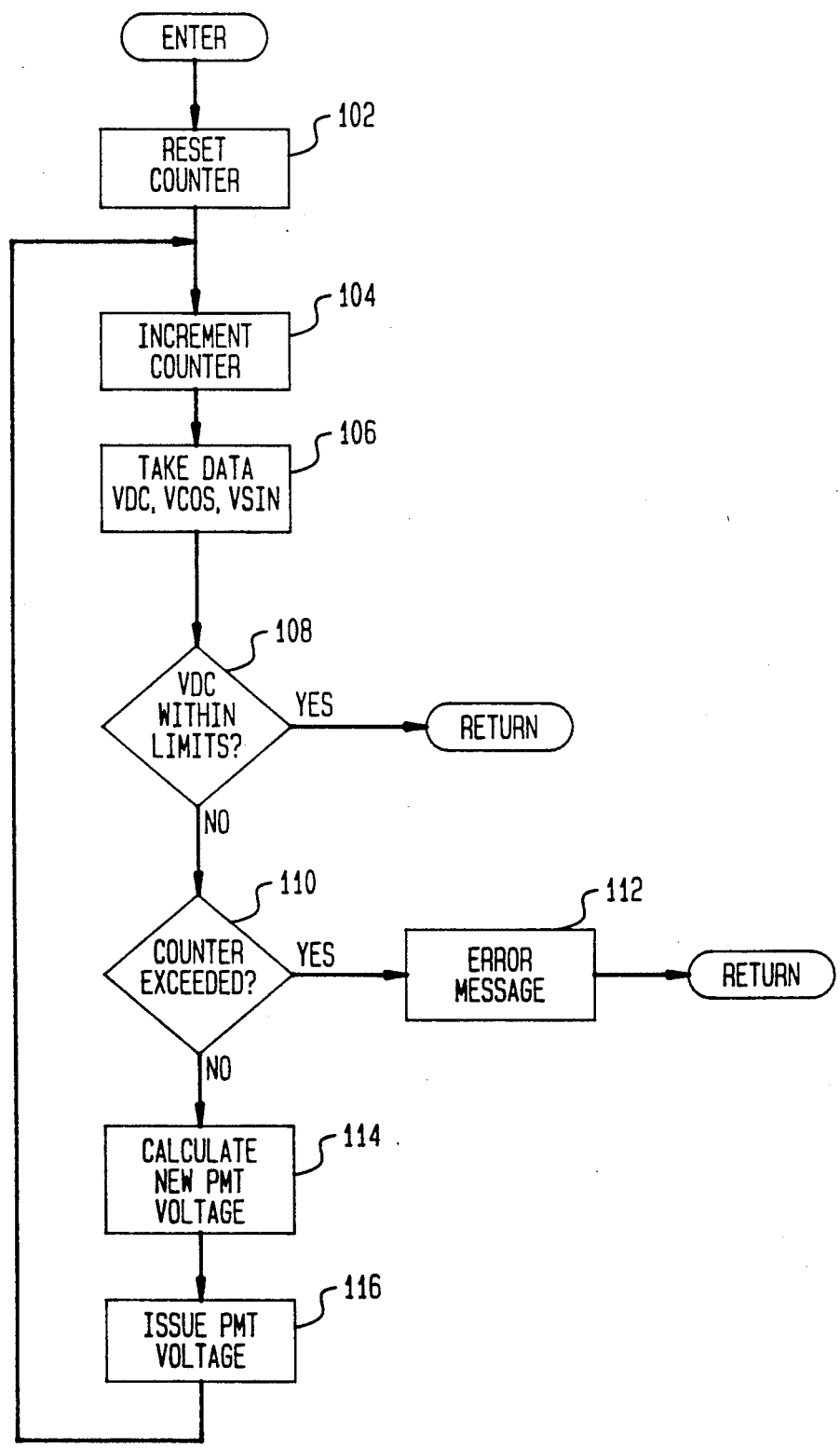
FIG. 6 is a logic flow chart for setting the photomultiplier tube voltage.

The control logic for the subroutine that sets the voltage of the photomultiplier tube 72 is shown in FIG. 6. Upon entry, a repeat counter is reset in step 102. In the first step 104 of the loop, the repeat counter is incremented by one. In step 106, the ellipsometric data VDC, VCOS, and VSIN are taken. This step 106 corresponds to steps 92, 94 and 96 in FIG. 5, although typically only 4 data cycles are accumulated (NR=4). In test 108, it is determined whether the DC coefficient VDC is within predetermined limits, for example, of (4.7±0.05) V so as to ensure that every part of the photomultiplier amplifier output voltage will lie within the 0–10 V range of the A/D converter for any possible value of $\rho$. If the voltage is within the limits, the subroutine is exited; if not, in test 110 it is determined whether the preset limit of the repeat counter has been exceeded. If so, in step 112 an error message is printed and the subroutine is exited; if not, control stays within the loop. In step 114, a new control voltage is calculated for the power supply of the photomultiplier tube. This calculation is based on the measured VDC and the change required to bring it to 4.7 V. In step 116, the new control voltage is issued to the photomultiplier tube power supply through the D/A converter output of the second computer of the computer system 38. Thereafter, the loop repeats.

Preliminary Experiments

Before the remainder of the apparatus of the invention is described, two preliminary experiments will now be discussed.

Figure 7:
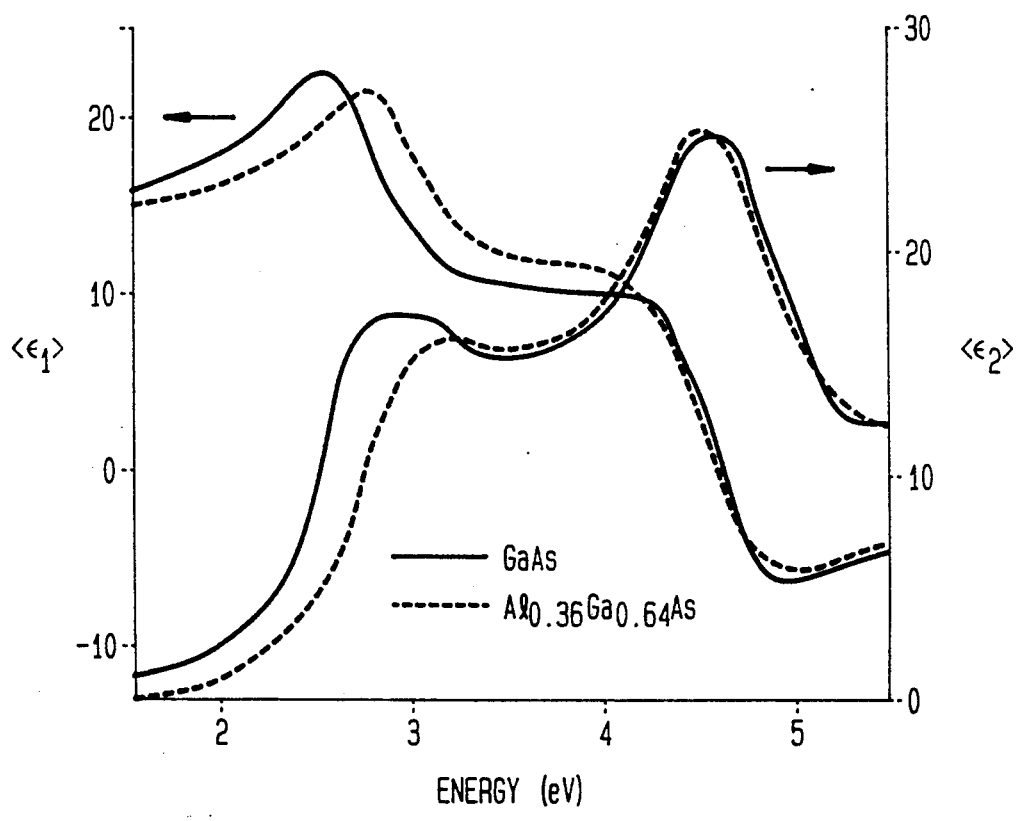
FIG. 7 is an illustration of the spectral energy dependence of the pseudo-dielectric function for two different materials.

Much technological interest centers on GaAs and its alloys with AlAs. Therefore, we used the spectrometer and growth chamber of FIG. 2 to measure the spectral dependences of the pseudo-dielectric function $<\bar{\epsilon}>$ of GaAs and $Al_{0.36}Ga_{0.64}As$. No growth control was performed in these preliminary experiments. Because there measurements were performed upon optically thick films, $<\bar{\epsilon}> \approx \bar{\epsilon}$. The spectral dependences of $<\epsilon_1>$ and $<\epsilon_2>$ illustrated in FIG. 7 show that 2.6 eV is a favorable energy at which to monitor the growth of the alloys of $Al_xGa_{1-x}As$ because of the strong dependence of $<\bar{\epsilon}>$ on the alloying percentage x arising from the $E_1$ and $E_1+\Delta_1$ transitions at this energy. The choice of 2.6 eV allows a measured value of $\epsilon_2$ for an optically thick film to be converted to a composition x, as will be described below. Although data for only one temperature are shown, the dielectric function at this energy is also dependent, although less strongly, on growth temperature.

Figure 8:
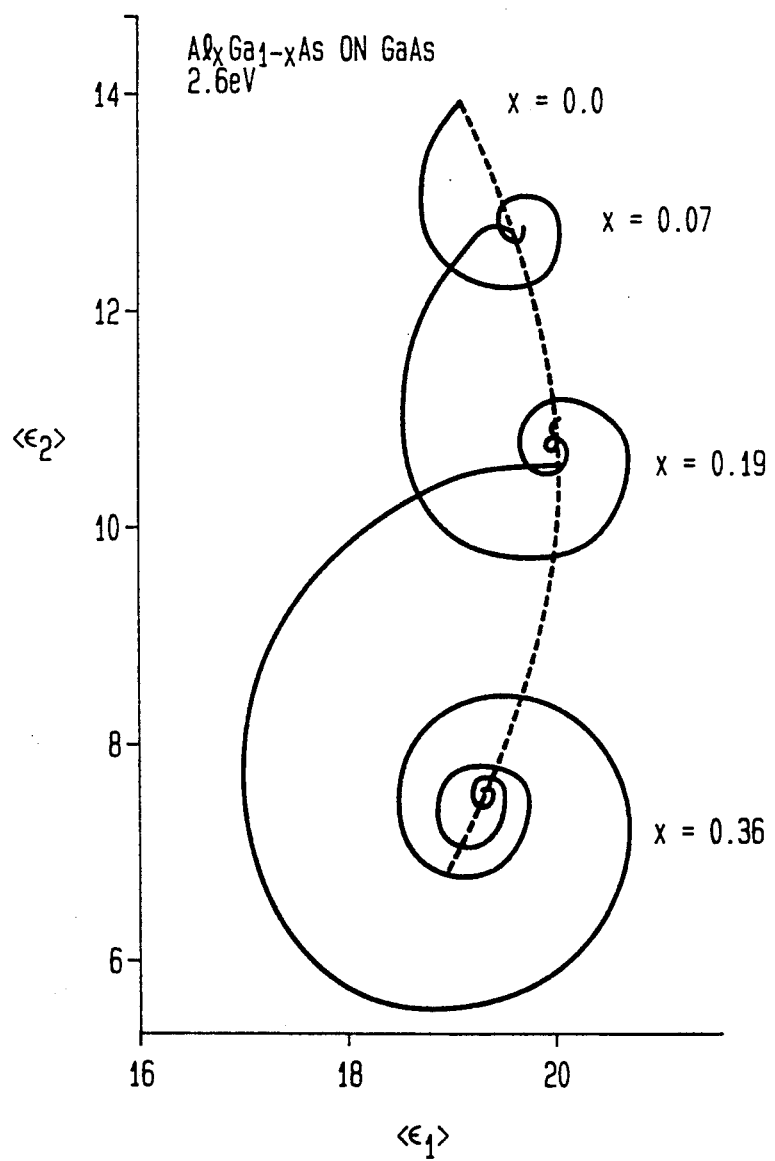
FIG. 8 is an illustration of the locus of the pseudo-dielectric function during growth of a multi-layer structure.

Accordingly, the spectrometer was set to an energy of 2.6 eV for real-time measurements of the pseudo-dielectric function $<\bar{\epsilon}>$ in another preliminary experiment. A GaAs substrate was loaded into the OMMBE station. Layers of $Al_xGa_{1-x}As$ were sequentially grown at 600° C. with x=0.07, 0.19 and 0.36. Each of the layers was grown to a thickness of about 275 nm thick. The pseudo-dielectric function was measured during the deposition. When the real and imaginary parts $<\epsilon_1>$ and $<\epsilon_2>$ of the pseudo-dielectric function are plotted against each other, there results the series of spirals of FIG. 8. The spirals begin at the bulk value of $\bar{\epsilon}$ of the optically thick substrate layer and converge to a different value corresponding to the bulk value of $\bar{\epsilon}$ of the optically thick grown film. Similar loci are obtained when the ellipsometric data are represented by $\psi$ and $\Delta$, as has been reported in the previously cited articles by Hottier et al and Laurence et al.

First, it is observed that the end-point values, that is, $\bar{\epsilon}$ can be approximated by an analytic expression $$\bar{\epsilon}=\bar{\epsilon}_s+(9.22x-24.14x^2)+i(-16.94x-0.33x^2), \quad (14)$$

where xi is the alloying fraction and $\bar{\epsilon}_s$ is the 2.6 eV dielectric function of the GaAs substrate. This equation is represented by the dashed line in FIG. 8. Such an equation can be used to relate the measured value $\bar{\epsilon}$ to the composition x. The drift, resembling a pig tail, in x by 0.02 at the end of the second spiral was caused by a swelling of the seal in the triethylaluminum valve 26.

The spiral loci of $<\bar{\epsilon}>$ can be explained in terms of the Fresnel reflectance expressions of the so-called three-phase (substrate 1, overlayer 2, ambient 3) model where the boundaries between the substrate, overlayer, and ambient phases are mathematically sharp. If $r_{12}$ and $r_{23}$ are the reflectances at the substrate-overlayer and overlayer-ambient interfaces, respectively, then as described, e.g., by Azzam and Bashara, the reflectance $r_{13}$ of the three-phase system is given by $$r_{13} = \frac{Zr_{12} + r_{23}}{Zr_{12}r_{13} + 1}, \quad (15)$$

where $$Z = e^{2ikd}, \quad (16)$$

and $$\frac{ck}{\omega} = (\bar{\epsilon}_0 - \sin^2\phi)^{\frac{1}{2}}, \quad (17)$$

and where $\phi$ is the angle of incidence, k is the wave vector of the probing light, $\epsilon_o$ is the complex dielectric constant for the bulk overlayer material, c is the speed of light, and $\omega$ is the frequency of the probing light. Equations (15) through (17) are valid for both s and p polarized light as long as the appropriate expressions for $r_s$ and $r_p$ are substituted for $r_{ij}$, respectively, see Azzam and Bashara. Specifically, $r_s$ and $r_p$ are defined in terms of the dielectric functions $\bar{\epsilon}_s$, $\bar{\epsilon}_o$, and $\epsilon_a=1$ of the substrate, overlayer, and ambient, respectively.

If the dielectric functions of the substrate and overlayer are nearly the same, as is the case here, see FIG. 7, then $r_{12} \approx 0$ and Equation (15) can be expanded to first order in $r_{12}$. The resulting expression again to first order in $r_{12}$ is $$r_{13}=r_{23}+(r_{12}-r_{23})Z \quad (18)$$

If the overlayer is nonexistent (d=0, Z=1), then $r_{13}=r_{12}$, while if the overlayer is optically thick (d≈∞, Z≈0) then $r_{13}=r_{23}$. Between these extreme values, $r_{13}$ follows an exponential spiral with the period and rate of convergence determined by the real and imaginary parts of k as defined in Eq. (17).

As this functional form applies to both $r_s$ and $r_p$, it also applies to the ratio $\bar{\rho}=r_p/r_s$ and therefore also to $<\bar{\epsilon}>$. For larger $r_{12}$ such that the first-order expansion is not a good approximation, higher-order correction terms distort the simple exponential spiral form but the overall shape remains qualitatively the same.

Control Theory

The pseudo-dielectric function or other ellipsometric forms of data can be advantageously used to monitor both the composition $\bar{\epsilon}_o(d)$ and thickness d of growing layers. The use of the pseudo-dielectric function for control presents some difficulties however. Neither the pseudo-dielectric function $<\bar{\epsilon}>$ nor the complex reflectance ratio from which it is obtained provide direct information about the dielectric function $\bar{\epsilon}_o$ of the layer being deposited. This information must be derived from these data.

Several methods of achieving this goal can be used, such as directly fitting the exact Fresnel equations to the data without approximation using $\bar{\epsilon}_o$ and d as adjustable parameters, or calculating $\bar{\epsilon}_o$ itself by a suitable construction. The former method has the advantage of generality but requires substantial computing power. In a demonstration of the invention, we used a second method based on the approximation of Equation (18), which is applicable to the GaAs/Al$_x$Ga$_{1-x}$As system and is much simpler to implement.

In terms of the pseudo-dielectric function, we write Equation (18) as $$<\bar{\epsilon}(d)> = \bar{\epsilon}_o + (\bar{\epsilon}_s - \bar{\epsilon}_o)e^{i2kd} \quad (19)$$

Let us consider the two values $<\bar{\epsilon}(d+\Delta d/2)>$ and $<\bar{\epsilon}-\Delta d/2)>$, where $\Delta d$ is a thickness increment that we may select corresponding, e.g., to the difference between two or more successive ellipsometer readings. If $|k \cdot \Delta d| << 1$, then we have approximately $$<\bar{\epsilon}(\bar{d})> = \frac{<\bar{\epsilon}(d + \Delta d/2)> + <\bar{\epsilon}(d - \Delta d/2)>}{2} \quad (20)$$
$$\approx \bar{\epsilon}_0 + (\bar{\epsilon}_s - \bar{\epsilon}_0)e^{2ikd}$$

and $$\Delta<\bar{\epsilon}(\bar{d})> = \bar{\epsilon}(d + \Delta d/2)> - <\bar{\epsilon}(d - \Delta d/2)> \quad (21)$$
$$\approx 2ik\Delta d(\bar{\epsilon}_s - \bar{\epsilon}_0)e^{2ikd}.$$

The variable $\bar{d}$ indicates an average over a range $\Delta d$ centered about d.

We can now combine Equations (20) and (21) to eliminate the factor $(\bar{\epsilon}_s - \bar{\epsilon}_o)e^{2ikd}$, and solve the result for the desired overlayer dielectric function $\bar{\epsilon}_o$. The result is $$\bar{\epsilon}_0 = <\bar{\epsilon}(\bar{d})> - \frac{\Delta<\bar{\epsilon}(\bar{d})>}{2ik\Delta d}. \quad (22)$$

Because $<\bar{\epsilon}(\bar{d})>$ and $\Delta<\bar{\epsilon}(\bar{d})>$ are measured values, we can obtain the desired quantity $\epsilon_o$ from measurement if we make appropriate estimates for $\Delta d$ and k. In practice, 10% accuracy is sufficient for these estimates.

The expression is actually much more general than the Fresnel derivation would indicate because the substrate-overlayer reflectance $r_{12}$ is really the ratio of the reflected to incident electric fields at the boundary 1-2. As this ratio is definable even in the absence of a boundary, we can suppose the existence of a running virtual boundary $N_{pts} \cdot \delta d$ deep, where $N_{pts}$ is the number of points that we can average to obtain better estimates of $<\bar{\epsilon}(\bar{d})>$ and $\Delta<\bar{\epsilon}(\bar{d})>$ and $\delta d$ is the thickness increment of the film per point. Thus, Equation (22) yields the dielectric response of the outermost region of the overlayer of thickness $N_{pts} \cdot \delta d = \Delta d$.

According to Equation (14), the imaginary part of the dielectric constant $Im\{\bar{\epsilon}_o(d)\}$ varies almost linearly with x. A target imaginary dielectric constant $\epsilon_{t,2}$ can be derived from Equation (14) for a target alloying percentage $x_t$. Then, the difference in imaginary parts is proportional to the difference in alloying percentages $\Delta x = x(d) - x_t$, that is $$Im\{\bar{\epsilon}_o(d)\} - \epsilon_{t,2} = \alpha_1 \cdot \Delta x \quad (23)$$

where $\alpha_1 = -16.94$ from Equation (14). Combining Equations (22) and (23) produces the control equation $$\alpha_1 \cdot \Delta x = \quad (24)$$

$$Im\left\{<\bar{\epsilon}(d)> - \frac{i}{2k\Delta d}[<\bar{\epsilon}(d + \Delta d)> - <\bar{\epsilon}(d)>]\right\} - \epsilon_{t,2}.$$

The only remaining undetermined quantity in Equation (24) is $\Delta d$. This quantity can be calibrated by separate measurement or calculated from flow-rate data to the sufficient accuracy of 10%.

With all parameters thus determined, Equation (24) can be used as the control equation in which $\Delta x$ is reduced to zero. That is, the sign and magnitude of $\Delta x$ are used to feed back control signals to the growth system such that the magnitude of $\Delta x$ is reduced.

One difficulty in achieving fine control with the present implementation is that the $<\bar{\epsilon}(d)>$ signal is relatively noisy on the time scale of $\delta d$. In order to remove the noise and avoid instabilities, $\bar{\epsilon}_o(d)$ is obtained from a running average of $N_{pts}$ of pseudo-dielectric data. In particular, we least-squares fit $N_{pts}$ equally spaced points lying on a straight line to the last $N_{pts}$ points of data plotted in the complex $<\bar{\epsilon}>$ plane. Then $<\bar{\epsilon}(d)>$ and $(<\bar{\epsilon}(d+\Delta d)> - <\bar{\epsilon}(d)>)/\Delta d$ are equal to the midpoint and slope, respectively, of this line.

Furthermore, to avoid instabilities in the system and to reduce the effect of noise, the valve voltage $V_v$ is corrected only incrementally for a given value of $\Delta x$. Thus, for every point the new valve voltage $V_v'$ is related to the old valve voltage $V_v$ by $$V_v' = V_v + C_1 \cdot \Delta x \quad (25)$$

where the control constant $C_1$ is chosen to increment $V_v$ by a selected fraction of the total error on each point, typically 1-2%. The sign of $C_1$ is chosen to reduce $\Delta x$ to zero. The size of $C_1$ for immediate 100% correction is an experimentally known parameter of the growth system and the material family. Thus, compositional errors are incrementally reduced to zero over a period of time determined by the operator.

The above procedure allows other forms of averaging to be used in the system, e.g., on $<\bar{\epsilon}(d)>$ itself, as long as the time constants of the other forms of averaging are short compared to that of Equation (25). We have found it to be advantageous to average $<\bar{\epsilon}(d)>$ over $N_{pts}$ points to better follow local fluctuations in composition, as long as the correction fraction $C_1 \cdot \Delta x < 1/N_{pts}$.

Other types of control may be used with different combinations of proportional, integral, derivative and time-filtered feedback, for example.

Growth Control Logic

Figure 9:
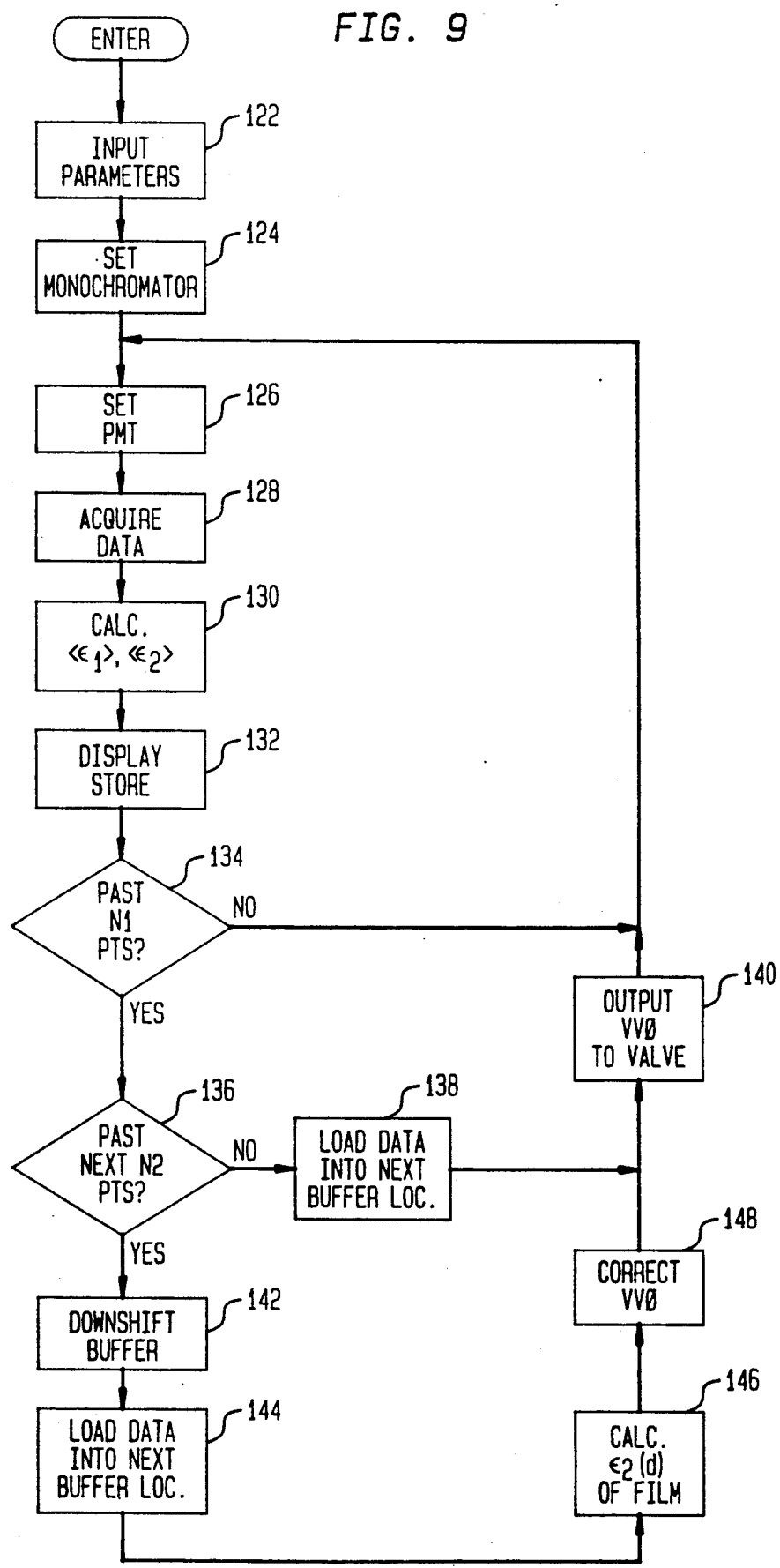
FIG. 9 is a logic flow chart for the control of growth.

The control of the growth was performed by a program stored and executed in the second computer of the computer system 38. The logic flow chart for the control program is shown in FIG. 9. This program was written for an example of the invention in which Al-GaAs is grown on a GaAs substrate. Only the Al source is dynamically controlled by the ellipsometer and the second computer. The Ga and As sources are controlled by the first computer of the computer system 38 and are turned on to grow additional GaAs before the illustrated program is executed.

The procedure begins in step 122 by loading the control parameters from the keyboard of the computer system 38. The parameters include $\epsilon_{t,2}$, the target imaginary part of the dielectric function calculated from Equation (14) for a given target alloying percentage x and the estimated starting voltage setting $V_v$ or VV0 for the triethylaluminum valve 26 calibrated for x. The target dielectric constant $\epsilon_{t,2}$ is calculated from Equation (14) based on x. However, the triethylaluminum valve 26 is initially closed with an issue valve of VV0=0 V. In step 124, the monochromator is run to the measurement energy, here selected to be 2.6 eV.

The loop begins by transferring control in step 126 to the photomultiplier voltage setting subroutine, described in FIG. 6, for checking the photomultiplier tube voltage and for adjusting it if necessary. Intensity data are then acquired in step 128 with a call to the procedure of FIG. 5. In step 130, the pseudodielectric constants $<\epsilon_1>$, $<\epsilon_2>$ are calculated according to Equations (9), (10), (11), (4), and (7). In step 132, the calculated pseudo-dielectric constants values are stored and displayed, preferably plotted against each other on an x-y plotter. This completes the measurement part of the control cycle. The program continues with the evaluation of the correction to the control voltage VV0.

In order to establish a baseline, the illustrated program allows by the operation of test 134 for N1 points to be taken before AlGaAs growth begins. A typical value of N1 is 10.

The feedback control, to be described later, takes an average of $N_{pts}$ data points in order to determine smoother values of $\bar{\epsilon}_o$. In FIG. 9, $N_{pts}$ is represented by N2. Therefore, as determined in test 136, the next ($N_{pts}-1$) points of pseudo-dielectric data are stored in locations 2 to $N_{pts}$ in a data buffer in step 138. A typical value of $N_{pts}$ is 31. In step 140, the current value voltage VV0 is output to the valve 26. The first execution of step 140 begins the growth of the AlGaAs film. Prior to the accumulation of $N_{pts}$ data points, the estimated starting value of VV0 is output is output.

Once ($N_{pts}-1$) points of pseudo-dielectric data have been loaded into the buffer, control of branch 136 passes to step 142. In step 142, the buffer is down shifted by one to accommodate the most current data which in step 144 are loaded into the last buffer location. The oldest data point is eliminated in the process.

In step 146, the most recent $N_{pts}$ data values are used to calculate the imaginary dielectric constant $\epsilon_{2,o}(d)$ of the film according to Equation (22) and the least-squares procedure described above. The ratio of the average spacing between the individual $N_{pts}$ points of the real and imaginary parts of $<\bar{\epsilon}>$, multiplied by the indicated constants, provide the derivative portion of Equation (22). The dielectric constant portion of the constant k, defined in Equation (17), is approximated by either the most recent value of $\bar{\epsilon}_o(d)$ or the target value $\bar{\epsilon}_t$. The fit is interpolated to the average value of d for the $N_{pts}$ points to provide $<\bar{\epsilon}(d)>$. Thereby, $\bar{\epsilon}_o(d)$ is calculated according to Equation (22) from the last $N_{pts}$ data points.

In step 148, the corrected valve voltage $V_v'$ or VV0 is calculated from Equations (24) and (25). The corrected valve control voltage VV0 is then issued to the valve controller 26 in step 140 via the D/A output of the second computer and the cycle repeats. The period of the cycle is about 1 second.

While no growth termination was explicitly provided in the example program of FIG. 9, growth could be terminated based on the standard mass flow calibration. A procedure is described below to use the invention to additionally measure the thickness of a deposited film, which would be used as the termination condition.

Figure 10:
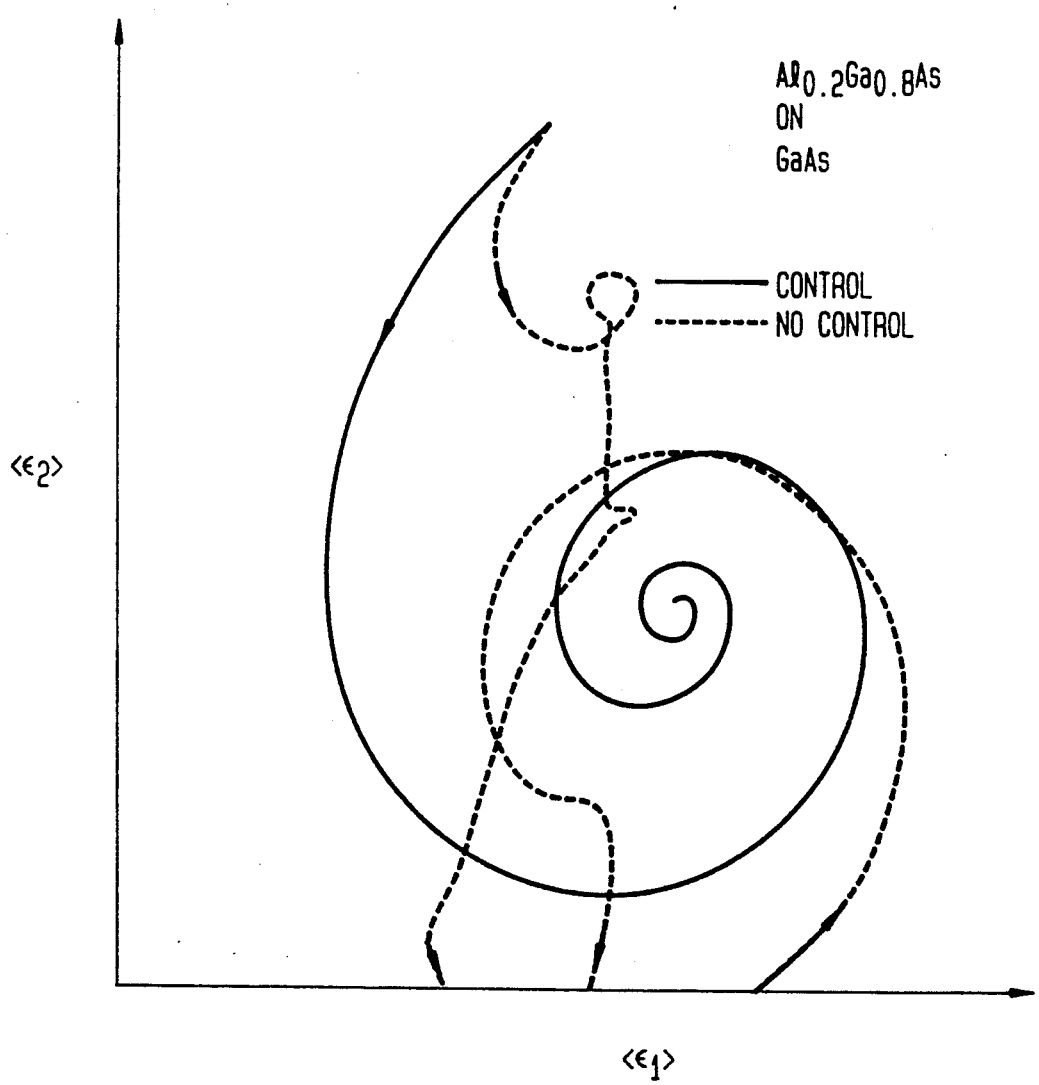
FIG. 10 is an illustration of the loci of the pseudo-dielectric function during controlled and non-controlled growth of a thin film.

An example of the effectiveness of the present control scheme for maintaining composition of a thick $Al_x$-$Ga_{1-x}As$ sample over an extended period of time is illustrated in the pseudo-dielectric loci shown in FIG. 10. An $Al_{0.20}Ga_{0.80}As$ film was grown on a GaAs substrate with the OMMBE growth system and ellipsometer of FIG. 2. The pseudo-dielectric functions were recorded during growth. First, growth was controlled according to the program of FIG. 9. The locus of the resulting pseudo-dielectric constants is represented by the solid line (some of the noise has been smoothed out of FIG. 10). The spiral locus indicates uniform composition of the film grown under feedback control. Immediately thereafter, in a comparison experiment another $Al_{0.20}Ga_{0.80}As$ film was grown on a fresh GaAs substrate. In the comparison experiment, the valve control signal VV0 was fixed at the value established at the end of the controlled experiment. That is, the second film was grown with no real-time feedback control. The resulting locus is shown by the dashed line in FIG. 10. The extreme variations in the comparison trajectory show that the OMMBE growth system was not performing adequately. Upon further data review, the valve control voltage VV0 was found to be undergoing large excursions during the controlled experiment. It therefore appears that even during the controlled experiment the OMMBE system was malfunctioning but the feedback control nonetheless produced a uniform film of the desired composition.

Other Embodiments

The invention can be applied to a production environment in which a pseudo-dielectric locus has been established as the standard for a production run of multi-layer structures. There is no requirement that any layer be grown optically thick. Any deviation from the standard locus results in the controlled change of the metering device. The direction of deviation determines the direction of change, which reflects the new focal point of the spiral determined by the new composition. For instance, in the spiral trajectory of AlGaAs on GaAs, an outward, or leftward as illustrated in FIG. 10, deviation in the upper initial part of the spiral indicates excess Al while an inward or rightward deviation indicates excess Ga. Such a standard locus could also be used to control layer thickness by terminating growth or changing stoichiometry when a specific point on the standard locus has been reached.

The invention can use the full three-phase model of Equation (15) or models incorporating additional phases. Further, these equations can be integrated over experimentally derived values of Δd to provide the thickness termination condition.

The invention is not limited to OMMBE growth of semiconductor thin films. Although the invention is particularly advantageous for semiconductor heterostructures in which there are small variations of a complex dielectric constant, the invention can be applied to non-semiconductor films as long as the film and the substrate have different dielectric constants. The invention can also be used for different growth methods, for example, vapor sources using mass flow or pressure control, e-beam evaporators and thermal evaporators. For effective dynamic control, the amount of material emitted by one of the sources should be changeable on a short time scale. The invention can advantageously be used in a relatively high-pressure environment, such as chemical vapor deposition, that precludes the use of electron spectroscopy. Although the embodiment discussed here uses only a single wavelength, one can envision the use of multiple wavelengths selected to optimize independently sensitivities to thickness and compositions.

The invention thus provides for the precise control of material composition and thickness in the growth of thin films. The ellipsometric equipment is relatively inexpensive and imposes few constraints on the growth procedure. Nevertheless, it offers a precision and reproducibility not previously available.

What is claimed is:

1. A controlled growth apparatus, comprising:
   a chamber capable of holding a substrate onto which a film is grown;
   a plurality of sources within said chamber capable of simultaneously irradiating a surface of said substrate with a plurality of respective growth species to form said film;
   at least one metering device capable of controlling an amount of a respective one of said species irradiated upon said surface;
   an ellipsometer operable during an operation of said sources, illuminating said surface with a beam of light, and providing a time-ordered sequence of a plurality of ellipsometric data from light reflected by said surface from said beam of light; and
   a controller generating a control signal from said time-ordered sequence of said plurality of said ellipsometric data, said control signal independently controlling each of said at least one metering device during said operation of said sources.

2. A controlled growth apparatus as recited in claim 1, wherein said controller generates said control signal based upon a predetermined composition of said film.

3. A controlled growth apparatus as recited in claim 2, wherein said control signal dynamically controls relative amounts of said growth species irradiated by said sources.

4. A controlled growth apparatus as recited in claim 2, wherein there are at least three of said sources, whereby said predetermined composition is at least a ternary composition.

5. A controlled growth apparatus as recited in claim 1, wherein said control signal causes said sources to dynamically vary a composition of said film.

6. A controlled growth apparatus as recited in claim 1, wherein said ellipsometric data are in a form of pairs of complementary ellipsometric data characterizing a polarization state of said reflected light.

7. A controlled growth apparatus as recited in claim 6, wherein said controller differences different pairs of said complementary ellipsometric data in said time-ordered sequence to produce differences and generates said control signal from said differences.

8. A controlled growth apparatus as recited in claim 7, wherein said controller compares each of said differences with an average of said pairs of said complementary ellipsometric data to produce a second difference and compares said second difference with a target value of ellipsometric data to thereby generate said control signal.

9. A method of controllably growing a film, comprising the steps of:
   simultaneously irradiating a surface with a plurality of growth species, whereby a film is grown on said surface;
   illuminating said surface with an incident beam of light during said irradiating step, whereby light is reflected from said surface in a reflected beam of light;
   deriving ellipsometric data from said incident and reflected beams; and
   dynamically controlling said irradiating step in response to said ellipsometric data, wherein said controlling step controls relative rates at which said irradiating step irradiates said surface with said plurality of species.

10. A method as recited in claim 9, wherein said irradiating step irradiates said surface with at least three of said growth species.

11. A method as recited in claim 9, wherein said controlling step controls said irradiating step additionally according to a predetermined composition of said film.

12. A method as recited in claim 9, wherein said deriving step uses a model for at least three layers, said film comprising an intermediate one of said three layers.

13. A method as recited in claim 9, wherein said deriving step derives said ellipsometric data in a form of a plurality of pairs of complementary ellipsometric data, said pairs being obtained at different times during a continuing operation of said irradiating step and said controlling step controls said irradiating step in response to a time-ordered sequence of said pairs.

14. A method as recited in claim 13, wherein said deriving step compares different ones of said pairs of complementary ellipsometric data arranged in said time-order sequence to obtain differences and controls said irradiating step in response to said differences.

15. A method as recited in claim 14, wherein said deriving step compares said difference with an average of said complementary ellipsometric data to obtain a second difference and then compares said second difference with a target value of said ellipsometric data to produce control data by which said irradiating step is controlled.

16. For use with a growth apparatus including a plurality of sources simultaneously irradiating a surface with different growth species to form a multi-element film thereon and at least one metering device controlling a relative amount of the different species irradiated by the associated source, an ellipsometric growth control apparatus comprising:
   an ellipsometer operable during an operation of said sources, illuminating said surface with a beam of light, and providing complementary ellipsometric data from light reflected by said surface from said beam of light, said complementary ellipsometric data characterizing a polarization state of said reflected light; and
   a controller receiving data from said ellipsometer during said operation of said sources and generating a control signal from a time-ordered sequence of said ellipsometric data for controlling said relative amount of said growth species irradiated by said sources.

17. A control apparatus as recited in claim 16, wherein said controller compares different pairs of said complementary ellipsometric data to produce differences and generates said control signal from said differences.

* * * * *

Disclaimer and Dedication

5,091,320—David E. Aspnes, Watchung; William E. Quinn, Middlesex Boro, both of N.J. ELLIPSOMETRIC CONTROL OF MATERIAL GROWTH. Patent dated February 25, 1992. Disclaimer and dedication filed April 4, 1995, by the assignee, Bell Communications Research, Inc.

Hereby disclaims and dedicates to the public the entire term of said patent.
(*Official Gazette* September 5, 1995.)